United States Patent [19]

Young et al.

[11] Patent Number: 4,705,606
[45] Date of Patent: Nov. 10, 1987

[54] THIN-FILM ELECTRICAL CONNECTIONS FOR INTEGRATED CIRCUITS

[75] Inventors: Peter L. Young, South Barrington; Jay Cech, Elmhurst; Kin Li, Lombard, all of Ill.

[73] Assignee: Gould Inc.

[21] Appl. No.: 697,092

[22] Filed: Jan. 31, 1985

[51] Int. Cl.[4] .............................................. C25D 5/02
[52] U.S. Cl. ...................................... 204/15; 204/38.4
[58] Field of Search ................................. 204/15, 38.4

[56] References Cited

U.S. PATENT DOCUMENTS

| | | | |
|---|---|---|---|
| 4,134,125 | 1/1979 | Adams et al. | 357/54 |
| 4,210,885 | 7/1980 | Ho | 333/238 |
| 4,254,445 | 3/1981 | Ho | 361/392 |
| 4,349,862 | 9/1982 | Bajorek et al. | 361/401 |
| 4,430,690 | 2/1984 | Chance et al. | 361/321 |

OTHER PUBLICATIONS

Davidson, "Electrical Design of a High Speed Computer Packaging System", *IEEE Transactions on Components, Hybrids, and Manufacturing Tech.*, CHMT-6, #3, (1983), 272-282.
Moriya et al, "A Planar Metallization Process . . . ", *International Electron Devices Meeting 1983 IEEE*, (1983), 550-552.
Lewis, "High-Density High-Impedance Hybrid Circuits . . . ", *IEEE Transactions on Components, Hybrids, and Mfg. Tech.*, CHMT-2, #4, (1979), 441-450.
Moriya et al., "High-Density Multilayer Interconnection with Photo-Sensitive . . . ", 1984 *Proceedings of the 34th Elec. Components Conf.*, (1984), 82-87.

Primary Examiner—T. M. Tufariello
Attorney, Agent, or Firm—E. E. Sachs

[57] ABSTRACT

A method for fabricating thin-film multilayer interconnect signal planes for connecting semiconductor integrated circuits is described. In this method, a first pattern of thin-film metallic interconnect lines is formed on a surface of a substrate. Then a first dielectric layer is formed over the entire surface of the substrate covering the pattern of thin-film metallic interconnect lines. A portion of the dielectric layer is then removed to expose the thin-film metallic interconnect lines so that a series of trenches is formed above each interconnect line. The interconnect lines are then electroplated to form a series of thicker metal interconnect lines such that the thicker metal interconnect lines and the dielectric layer form a substantially planer surface. This process can then be repeated in its entirely to form a plurality of interconnect signal planes. In the preferred embodiment, metallic vias are provided between each layer of metallic interconnect lines for electrical connection purposes.

16 Claims, 4 Drawing Figures

THIN-FILM ELECTRICAL CONNECTIONS FOR INTEGRATED CIRCUITS

BACKGROUND OF THE INVENTION

This invention relates generally to devices and methods of forming electrical connections for integrated circuits and more specifically relates to devices and methods of fabricating thin-film multilayer, interconnect signal planes for connecting semiconductor integrated circuits.

In order to fully take advantage of the performance of VLSI devices that will become available in the near future, the packaging of the chips in a computer system becomes a very important issue. The package must be capable of (i) handling a large number of signal lines, (ii) minimizing the distortion and delay of pulses propagating between chips, and (iii) enhancing its capability to dissipate an increasing amount of heat generated by the VLSI chips.

Very sophisticated, high-density multilayer circuit boards (MLB) are available which currently meet the requirements of presently available integrated circuit devices. However, a significant extension of the present packaging technology or the development of a new technology is expected to be needed to satisfy future requirements for the next generation of both mainframe and super minicomputers that will appear in the market in the next two to four years. Furthermore, increasing sophistication in military electronics demands similar advances in packaging in that application.

The advantage of applying thin-film technology to fabricate high-performance packages for semiconductor devices was recognized by researchers at Raytheon Corporation. This research is described in Lewis, "High-Density High-Impedance Hybrid Circuit Technology for Gigahertz Logic" *IEEE Transactions on Components, Hybrids, And Manufacturing Technology,* CHMT-2, No. 4 (Dec. 1979) 441–450. The conclusion of their work is that if the thickness of the natural conductor is over 1.7 microns, the yield of making such a thin-film package is essentially zero. They trace the difficulty to a well-known problem in semiconductor fabrication known as step coverage. The most obvious difficulty can be easily seen from FIG. 1. In depositing several microns of second-level metal over the first level, one immediately faces a very severe problem in step coverage. In the region where a second-level conductor crosses the edge of a first-level conductor 12, the metal line will be much thinner, leading to possible line breakage. Furthermore, if the dielectric layer is not thick enough, there is also a possibility that conductors in adjacent layers may be shorted. On the other hand, producing an overly thick dielectric layer is time consuming, and will be harder to etch through for via hole formation.

In conventional semiconductor fabrication technology where the thickness of the interconnect metal conductor lines are approximately ½ to 1 micron thick, there have been attempts to planarize multilayer interconnects. This is generally described in Moriya et al., "A Planar Metallization Process—Its Appliction to Tri-Level Aluminum Interconnection," *International Electron Devices Meeting* 1983 *IEEE* (1983) 550-553. Because of the vast difference in thickness of the metal conductor lines that is associated with a multichip package as opposed to a conventional semiconductor device, the technology associated with planarization in conventional semiconductor devices cannot easily be extended to the problems associated with the fabrication of multichip packages.

SUMMARY OF THE INVENTION

The invention can be described as a device for connecting semiconductor integrated circuits and as a method for fabricating thin-film multilayer interconnect signal planes for connecting semiconductor integrated circuits. In accordance with the invention, a thin-film metallic pattern is deposited on a substrate. A dielectric layer is then provided over the substrate and the metallic pattern. Thereafter, a portion of the dielectric layer is removed to expose the underlying metallic pattern and to form a series of trenches over the pattern. The metallic pattern is then electroplated to cause thicker metal interconnect lines to be formed such that the thicker metal interconnect lines and the remaining dielectric layer form a substantially planar surface. The dielectric layer is typically formed from a polymer which may be progressively cured during various fabrication stages to increase long-term reliability of the device and to affect the final thickness of the dielectric layer. This process can be repeated to form multiple interconnect signal planes. In the preferred embodiment, vias may be provided between signal planes for electrical connection purposes.

An object of the subject invention is to provide a method to fabricate multilayer interconnect signal planes in which each plane has a very high density of interconnect lines.

Another object of the present invention is to provide a method of fabricating planarized multilayer interconnect signal planes in which the characteristic impedance can be accurately controlled.

Another object of the present invention is to provide a method of fabricating multilayer interconnect signal planes in which the value of the characteristic impedance can be controlled to be between 30 to 200 ohms.

Another object of the present invention is to provide a method of fabricating multilayer interconnect signal planes which provides a reasonably high yield for commercial production purposes.

Another object of the present invention is to provide a method of fabricating multilayer interconnect signal planes which will enhance the performance of systems using high-speed semiconductor devices.

Another object of the present invention is to provide a manufacturing technique which is relatively easy to implement and is not unduly expensive.

These and other objects and advantages of the invention, as well as the details of an illustrative embodiment, will be more fully understood from the following description and the drawings.

DETAILED DESCRIPTION OF THE PREFERRED EMBODIMENT

Figure 1:
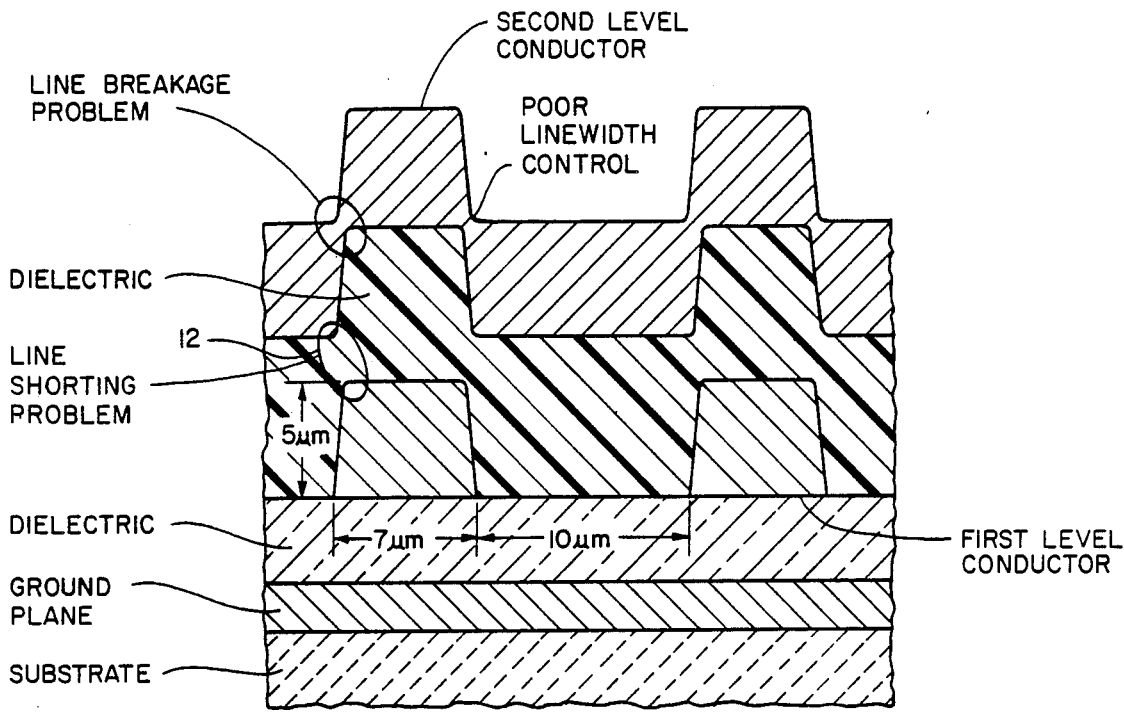
FIG. 1 is a cross-sectional schematic view illustrating a multilayer interconnect device using step coverage techniques common in the prior art.

In the preferred embodiment, the manufacture of each interconnect signal plane requires approximately ten (10) separate steps. These steps can be briefly described as follows:

1. Substrate preparation
2. Metallization
3. Polyimide application
4. Prebake
5. Exposure
6. Development
7. Plasma etch
8. Intermediate bake
9. Electroplating
10. Post bake Each of these steps will be described in greater detail below with respect to the preferred embodiment. In addition, alternative embodiments will be described as appropriate.

Step 1—Substrate Preparation

Figure 2:
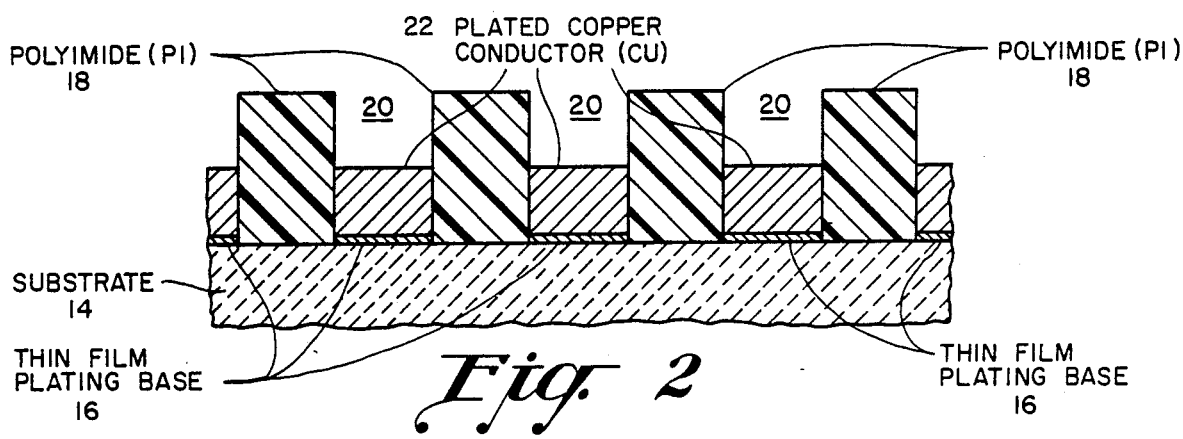
FIG. 2 is a cross-sectional schematic view illustrating the subject invention in an intermediate phase of fabrication.

The substrate 14, FIG. 2, is a standard silicon wafer in the preferred embodiment. Due to the particular materials used in the preferred embodiment, it is desirable to provide a diffussion barrier for the metal used in Step 2, discussed below. Other materials can be used as the substrate such as alumina, silicon carbide or other kinds of ceramic can also be used. The substrate goes through a standard cleaning procedure typically used for silicon wafers. The cleaning procedure includes a ten-minute immersion in a boiling solution of ammonium hydroxide, hydrogen peroxide and water. This is followed by a ten-minute rinse in flowing deionized water. After the wafer is rinsed, it is then immersed for ten minutes in a boiling solution of sulfuric acid and hydrogen peroxide. The second immersion is then followed by a second ten-minute rinse in flowing deionized water and then the wafer is spun dried in a nitrogen environment. It should be noted that other cleaning procedures can be used. The major objects of the cleaning step are to provide a wafer free of particles and organic contaminants.

Step 2—Metallization

In the preferred embodiment, the cleaned wafers are then loaded into planetary fixtures. A planetary fixture is a device in which a plurality of wafers may be subjected to rotation about an axis to ensure uniform metallization as discussed below. Typically, three planetary fixtures, each containing seven wafers, may be inserted in an evaporator at a time. In the preferred embodiment it is desired that approximately 100 Angstroms of chromium and 1,000 Angstroms of gold are deposited to form a continuous layer over a first surface of the substrate. Chromium is used for adhesion purposes.

The wafers are then patterned using standard photolithographic techniques to form a first pattern 16, FIG. 2, of thin-film metallic interconnect lines on the surface of the substrate. Generally, the thickness of the thin-film metallic interconnect lines is in the range of 500 to 5,000 Angstroms. In the preferred embodiment, the thickness of the thin-film metallic interconnect lines is approximately 1,000 Angstroms consisting of approximately 100 Angstroms of chromium overlaid by 900 Angstroms of gold. These thin-film are sufficiently thin that planarization is easily accomplished. It should be noted that in other embodiments, other materials may be used to form the thin-film metallic pattern such as copper or silver.

Another technique for providing the thin-film pattern is in the use of the "lift off" technique. In this technique, the wafer is coated with a photoresist on which the thin-film pattern is defined. Metal is then evaporated onto the defined pattern and the photoresist is rinsed away, leaving the metal adhering in only the desired areas.

Step 3—Polyimide Application

In the preferred embodiment, a photosensitive polyimide precursor 18, FIG. 2, is applied by spin coating on the patterned thin-film metallized substrate. In other embodiments, other methods of application may be used such as spraying, dipping and rolling. It should be noted that in other applications other materials may be used. These materials will be mentioned below and will not be discussed here since each particular material may require difference procedures than those discussed in the preferred embodiment.

Step 4—Prebake

The product produced by Step 3 is then prebaked at 70 degrees Centigrade for 180 minutes to remove the solvent and partially harden the polyimide precursor. The prebake time is dependent on the thickness of the polyimide precursor. The thickness of the polyimide precursor is typically 11 microns in the preferred embodiment.

Step 5—Exposure:

The polyimide precursor is next exposed using relatively standard photolithographic techniques. First a photomask containing a pattern of the thin-film metallic interconnect lines is aligned with the thin-film metallic interconnect lines on the substrate. In the preferred embodiment, it is possible to see the thin-film metallic interconnect lines through the dielectric in order to accomplish the alignment process. After alignment, the polyimide precursor is then exposed to ultraviolet light to render the exposed areas insoluble.

Step 6—Development

In the preferred embodiment, the exposed polyimide photoresist is then subjected to a fairly standard spray development technique. Other techniques may be used to develop the photoresist such as dipping techniques. In the spray technique, the wafer is placed on a spinner and then the developer is sprayed onto the spinning wafer. This technique is repeated until a series of trenches 20, FIG. 2, are formed over the thin-film metallic interconnect lines.

Step 7—Plasma Etch

After the trenches have been formed in Step 6, the device is then placed into a plasma etcher to remove any dielectric residue remaining in the trenches over the thin-film metallic interconnect lines. In the preferred embodiment, an eight percent oxygen/argon plasma is used at a pressure of 3 torr for 2 minutes at a power of 100 watts.

Step 8—Intermediate Bake

The wafers are then subjected to an intermediate bake procedure to partially cure the dielectric. In the preferred embodiment, this entails heating the wafers to 200 degrees Centigrade for 90 minutes. The purpose of the intermediate bake is to prepare the device for the next step which is the electroplating step. If the dielectric layer is not sufficiently cured prior to electroplating, the dielectric may peel off during the electroplating stage. One of the effects of the intermediate bake is to partially transform the polyimide precursor into polyimide.

Step 9—Electroplating

The thin-film metallic interconnect pattern is next subjected to an electroplating procedure. This procedure includes placing each wafer in a fixture in which electrical connection can be made to the thin-film metallic pattern. The wafer and fixture are then placed in an electroplating bath and a series of thicker metallic interconnect lines 22, FIG. 2, are formed over the thin-film metallic interconnect pattern.

It should be noted that the final thickness of the dielectric layer is chosen so that it is approximately equal to the thickness of the electroplated conductors. In the preferred embodiment, the thickness of the electroplated conductors is approximately 5 microns. In other embodiments, the thicker metal interconnect lines may be in the range of 1 to 10 microns. It should also be noted that other techniques for forming the thicker metal interconnect lines may be used such as electroless plating.

Step 10—Post Bake

The product produced by Step 9 is then subjected to a final bake to completely cure the polymer. In the preferred embodiment, the wafers are subjected to a post bake of 400 degrees Centigrade for 50 minutes in an inert atmosphere. The purpose of the post bake is to fully convert the polyimide precursor to polyimide. One of the effects of the conversion of the precursor to polyimide is to cause the polymer to shrink in a predictable fashion. After the precursor is completely converted, the polyimide dielectric layer and the thicker metal interconnect lines form a substantially planar surface.

Figure 3:
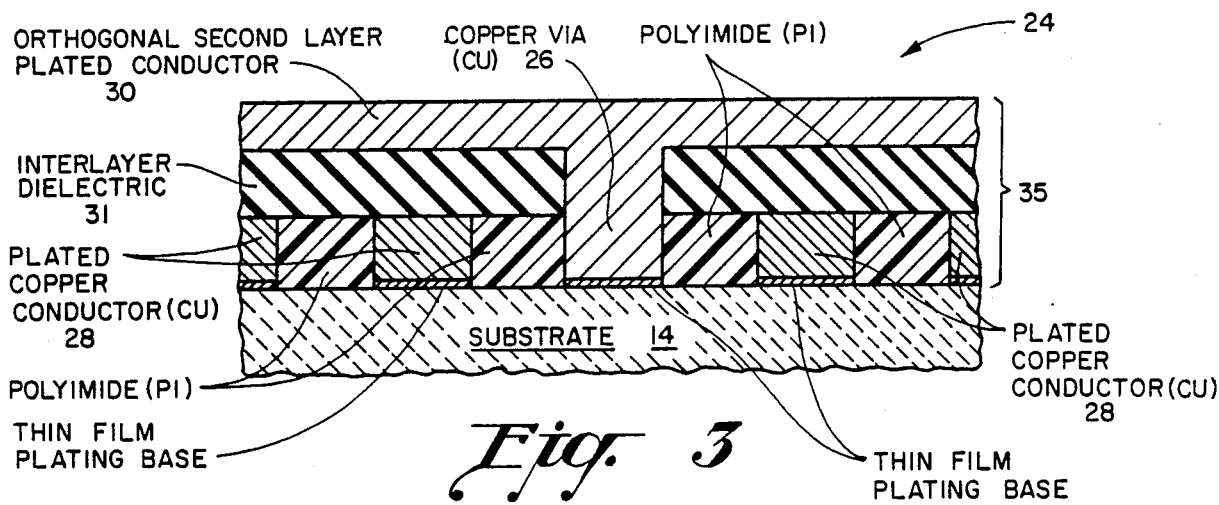
FIG. 3 is a cross-sectional schematic view illustrating a thin-film multilayer interconnect signal plane device fabricated using the subject invention having two signal planes.

The process described above may be repeated to produce multilayered interconnect signal planes for connecting multiple integrated circuits as illustrated by device 24 in FIG. 3. It should be noted that before the procedures described above are repeated to produce each signal plane, an intermediate layer of dielectric 31 must be deposited for insulation purposes. In the preferred embodiment, the intermediate layer contains vias 26, FIG. 3, for electrical connection between selected interconnect lines. In the preferred embodiment, the interconnect lines 28 in the lower plane are in a direction generally orthogonal to the interconnect lines 30 in the upper plane.

The intermediate dielectric layer and the metallic vias are produced in a fashion very similar to the production of the thicker metal interconnect lines. However, it is not necessary to produce a thin-film metallic base since the underlying metal conductors act as a base for the growth of metal in vias.

Figure 4:
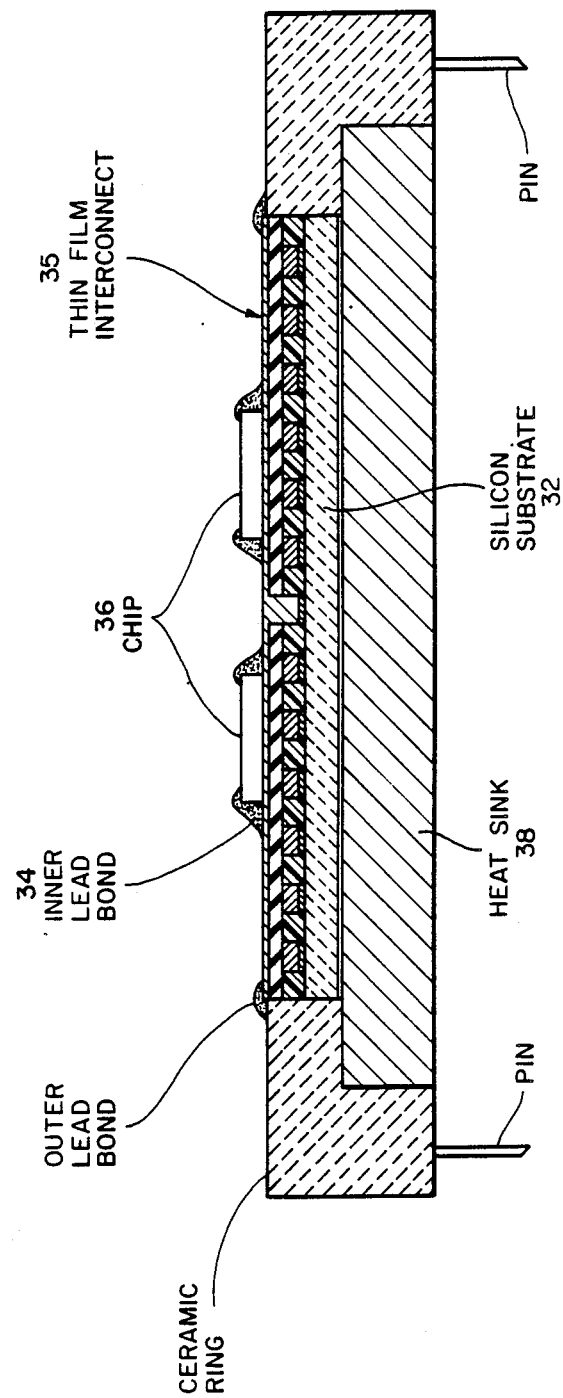
FIG. 4 is a cross-sectional schematic view of a multi-chip thin-film module.

After the device has been completely manufactured in accordance with the subject invention, a plurality of semiconductor integrated circuits may be electrically connected to the electrical interconnect planes of the subject invention. This is illustrated in FIG. 4. As can be seen in the figure, a silicon substrate 32 having thin-film multilayer interconnect signal planes 35 in accordance with the subject invention is electrically connected 34 to a plurality of semiconductor integrated circuits chips 36. As can be seen in FIG. 4, a heat sink 38 may be provided which is further described in U.S. patent application Ser. No. 698,472, filed Feb. 5, 1985 entitled A NEW MULTICHIP THIN-FILM MODULE.

It should be noted that in the preferred embodiment in which the thicker metal interconnect lines are formed using an electroplating procedure, it is desirable to have a path which electrically connects all the thin-film interconnect lines in a single plane during the electroplating procedure. In the preferred embodiment, this path is typically formed along a perimeter of the substrate so that the path can be subsequently destroyed after the thicker metallic interconnect lines have been formed. In other embodiments, this path may be located in other portions on the substrate. In those embodiments in which electroless plating is used to form the thicker metallic interconnect lines, this path is not necessary.

Alternative Embodiments

As noted above, the subject invention comprehends that numerous alternative embodiments may be used. For instance, instead of using a photosensitive polyimide precursor, a conventional polyimide precursor may be used. If a conventional polyimide precursor is used that is not photosensitive, different techniques must be used for creating patterns on the dielectric layer. Other techniques include masking the polyimide with an inorganic layer such as silicon dioxide or aluminum. These inorganic layers are patterned with conventional photolithography and serve as an etching mask for the polyimide. The etching procedure for the polyimide entails exposing the polyimide and mask structure to oxygen, or other plasma, which then removes the exposed areas which form the trenches discussed above.

Another variation in the invention is that other polymers may be used instead of any form of polyimide. For example, it may be possible to use polymethylmethacrylate, or polytetrafluoroethylene as the dielectric material. Another variation in the invention is to use non-polymeric materials as the dielectric layer. For example, silicon dioxide or silicon nitride may be used as the dielectric. If a non-polymeric material is used as the dielectric, a polymeric etching mask is typically applied and the above-discussed trenches are etched by liquid echants or plasma etching methods.

It is desirable to control the characteristic impedance of a multilayer interconnect device such as the device described herein due to the trade off which must take place between noise and distortion for electrical signals transmitted through the interconnect lines. This is discussed more throughly in Davison, "Electrical Design of a High Speed Computer Packaging System", *IEEE Transactions on Components, Hybrids, and Manufacturing Technology*, CHMT-6, No. 3, (Sept. 1983) 272–282.

The subject invention is advantageous in that the characteristic impedance can be controlled to be within 30 to 300 ohms because the subject invention provides for well-defined geometrics which are highly planar. In other words, the precise geometric configuration of the conductive interconnect lines and their relationship to the dielectric layers can be well controlled to produce interconnect lines which are substantially rectangular as opposed to trapezodial interconnect lines. The fact that the interconnect lines are substantially rectangular as opposed to trapezodical is important, not so much from any specific shape requirements, but is important from the point of view that the specific dimensions (regardless of what dimensions or shape are chosen) are highly reproducible and uniform using the fabrication methods described herein. The actual device produced in accordance with the methods described herein is closer to theoretical geometrics than devices using prior-art techniques.

The impedance of the device depends on the dielectric constant and its geometrical dimensions which can both be fabricated to high precision with the planarized electrical connection process discussed in this patent application. The planarized process is superior to other non-planar processes because firstly, all dimension of the device are better defined and secondly the planar process is inherently less susceptible to defects (either a short between the different metal layers, or an open within a metal layer). It is a practical way to make multi-metal layer with thin dielectric insulator layers in between the metal layer.

Although the invention has been described and illustrated in detail, it is to be clearly understood that the same is by way of illustration and example only, and is not to be taken by way of limitation; the spirit and scope of this invention being limited only by the terms of the appended claims.

What is claimed is:

1. A method of fabricating thin-film interconnect signal planes for connecting semiconductor integrated circuits comprising the steps of:
   forming a first pattern of thin-film metallic interconnect lines on a first surface of a substrate;
   forming a first dielectric layer on the entire area of said first surface of said substrate covering said first pattern of thin-film metallic interconnect lines;
   removing a portion of said first dielectric layer from said substrate in areas which cover said first thin-film metallic interconnect lines to form a first series of trenches above each interconnect line; and
   electroplating said first pattern of thin-film metallic interconnect lines to form a first series of thicker metal interconnect lines on top of said first pattern of thin-film metallic interconnect lines in said first series of trenches, said first series of thicker metal interconnect lines and said first dielectric layer forming a first substantially planer surface.

2. A method as recited in claim 1 further including the steps of:
   forming an intermediate dielectric layer on said first substantially planer surface;
   forming a second pattern of thin-film metallic interconnect lines on said intermediate layer;
   forming a second dielectric layer on the entire area of said intermediate layer covering said second pattern of thin-film metallic interconnect lines;
   removing a portion of said second dielectric layer from said intermediate layer only in areas which cover said second thin-film metallic interconnect lines to form a second series of trenches above each of said second thin-film metallic interconnect lines;
   electroplating said second thin-film metallic interconnect lines to form a second series of thicker metal interconnect lines on top of said second pattern of thin-film interconnect lines such that said second series of thicker metal interconnect lines and said second dielectric layer form a second substantially planer surface.

3. A method as recited in claim 1 wherein said first dielectric layer is formed from a polymeric material.

4. A method as recited in claim 3 wherein said polymeric material is a polyimide.

5. A method as recited in claim 1 further comprising the step of:
   curing said first dielectric layer after forming said first layer and before electroplating said first pattern of thin-film metallic interconnect lines to partially cure said first dielectric layer.

6. A method as recited in claim 5 further comprising the step of:
   curing said first dielectric layer after electroplating said first pattern of metallic interconnect lines to substantially totally cure said first dielectric layer.

7. A method as recited in claim 1 wherein said step of removing said portion of said first dielectric layer includes the step of:
   plasma etching said first dielectric layer.

8. A method as recited in claim 7 wherein said step of plasma etching said first dielectric layer further includes the steps of:
   forming a first layer of inorganic film on said first dielectric layer;
   etching said first layer of inorganic film in a first etching pattern defined by said first pattern of thin-film metallic interconnect lines whereby said first etching pattern and said first pattern of thin-film metallic interconnect lines are in alignment with one another and a portion of said first dielectric layer therebetween is exposed;
   subjecting said first layer of inorganic film and said exposed portion of said first dielectric layer to a plasma to cause said exposed portion of said dielectric layer to be removed to expose said first pattern of thin-film metallic interconnect lines.

9. A method as recited in claim 1 wherein said first dielectric layer is photosensitive and said step of removing a portion of said first dielectric layer further includes the step of:
   photolithographically exposing and removing said portion of said first dielectric layer.

10. A method as recited in claim 9 wherein said first dielectric layer is a photosensitive polyimide and said step of photolithographically exposing and removing said first dielectric layer further includes the steps of:
    exposing said photosensitive polyimide to form a first negative exposure pattern in negative alignment with said first pattern of thin-film metallic interconnect lines; and
    removing all unexposed photosensitive polyimide to expose the underlying first pattern of thin-film metallic interconnect lines.

11. A method as recited in claim 10 wherein said step of removing all photosensitive polyimide further includes:
    immersing said photosensitive polyimide in a selective organic solvent which removes the nonexposed polymide.

12. A method as recited in claim 1 wherein said first pattern of thin-film metallic interconnect lines are connected with one another in a path along a perimeter of said substrate and said method of fabricating thin-film multilayer interconnect signal planes further includes the step of:

destroying said path along said perimeter of said substrate after forming said first series of thicker metallic interconnect lines.

13. A method as recited in claim 1 further including the step of:
forming metallic vias between said first series of thicker metal interconnect lines and said second pattern of thin-film metallic interconnect lines.

14. A method as recited in claim 13 wherein said step of forming said vias includes:
forming an intermediate dielectric layer over said first substantially planer surface;

forming vias in said intermediate dielectric layer to expose portions of said first series of thicker metallic interconnect lines; and electroplating said portions of said first series of thicker metallic interconnect lines to produce metallic inserts wherein said metallic inserts and said third dielectric layer form an intermediate substantially planer surface.

15. A method as recited in claim 1 wherein said thin-film metallic interconnect lines have a thickness in the range of 500 to 5,000 Angstroms.

16. A method as recited in claim 1 wherein said thicker metal interconnect lines have a thickness in the range of 1 to 10 microns.

* * * * *